(12) United States Patent
Haemmerl et al.

(10) Patent No.: US 10,421,421 B2
(45) Date of Patent: Sep. 24, 2019

(54) HOUSING FOR A CONTROL UNIT

(71) Applicant: CONTINENTAL AUTOMOTIVE GMBH, Hannover (DE)

(72) Inventors: Hermann Haemmerl, Ergolding (DE); Gregory Drew, Zeitlarn (DE); Thomas Riepl, Bad Abbach (DE)

(73) Assignee: Continental Automotive GmbH, Hannover (DE)

( * ) Notice: Subject to any disclaimer, the term of this patent is extended or adjusted under 35 U.S.C. 154(b) by 173 days.

(21) Appl. No.: 15/324,921

(22) PCT Filed: Jun. 22, 2015

(86) PCT No.: PCT/EP2015/063899
§ 371 (c)(1),
(2) Date: Jan. 9, 2017

(87) PCT Pub. No.: WO2016/005172
PCT Pub. Date: Jan. 14, 2016

(65) Prior Publication Data
US 2017/0210308 A1 Jul. 27, 2017

(30) Foreign Application Priority Data
Jul. 8, 2014 (DE) .................. 10 2014 213 243

(51) Int. Cl.
*H05K 5/04* (2006.01)
*B60R 16/023* (2006.01)
(Continued)

(52) U.S. Cl.
CPC .......... *B60R 16/0239* (2013.01); *B23K 35/00* (2013.01); *B23K 35/002* (2013.01);
(Continued)

(58) Field of Classification Search
CPC ... B60R 16/0239; B32B 15/01; B32B 15/016; H05K 5/04; H05K 5/0239; H05K 5/03; B23K 35/002
(Continued)

(56) References Cited

U.S. PATENT DOCUMENTS

| 5,699,233 | A | 12/1997 | Zlamal | |
|---|---|---|---|---|
| 2003/0090872 | A1* | 5/2003 | Chu | ................. H01L 23/04 361/699 |

(Continued)

FOREIGN PATENT DOCUMENTS

| CN | 1898112 A | 1/2007 |
|---|---|---|
| DE | 10255158 A1 | 6/2004 |
| EP | 0287722 A1 | 10/1988 |

OTHER PUBLICATIONS

Manufacturing processes joining—Part 0: General—Classification, subdivision, terms and definitions; Sep. 2003; DIN 8593-0; DIN Deutsches Institut fuer Norm e.V.; Germany.

(Continued)

*Primary Examiner* — Stephen J Castellano
(74) *Attorney, Agent, or Firm* — Laurence A. Greenberg; Werner H. Stemer; Ralph E. Locher

(57) ABSTRACT

A housing for a control unit of a motor vehicle has a housing element and a further element attached to the housing element by way of a joining technique that does not include a joining layer or by way of a joining layer. The housing element has a main body composed of a light metal and a protective layer applied to the main body. The protective layer is arranged between the main body and the attached further element. The invention further relates to a method for producing a housing and to a control unit.

7 Claims, 3 Drawing Sheets

(51) Int. Cl.
  *B23K 35/00*  (2006.01)
  *B32B 15/01*  (2006.01)
  *B23K 35/28*  (2006.01)
  *B23K 35/02*  (2006.01)
  *C23C 2/12*   (2006.01)
  *H05K 5/00*   (2006.01)
  *H05K 5/02*   (2006.01)
  *H05K 5/03*   (2006.01)

(52) U.S. Cl.
  CPC ...... *B23K 35/0244* (2013.01); *B23K 35/0255* (2013.01); *B23K 35/0261* (2013.01); *B23K 35/0272* (2013.01); *B23K 35/28* (2013.01); *B23K 35/286* (2013.01); *B32B 15/01* (2013.01); *B32B 15/016* (2013.01); *C23C 2/12* (2013.01); *H05K 5/0017* (2013.01); *H05K 5/0052* (2013.01); *H05K 5/0239* (2013.01); *H05K 5/03* (2013.01); *H05K 5/04* (2013.01)

(58) Field of Classification Search
  USPC ...................................................... 220/573.1
  See application file for complete search history.

(56) References Cited

U.S. PATENT DOCUMENTS

| | | |
|---|---|---|
| 2003/0178477 A1 | 9/2003 | Rak et al. |
| 2008/0017174 A1 | 1/2008 | Kafer et al. |
| 2009/0190290 A1 | 7/2009 | Lynch et al. |
| 2014/0096943 A1* | 4/2014 | De Pelsemaeker ..... F28F 19/06 165/134.1 |
| 2014/0326733 A1* | 11/2014 | Park ..................... A47J 27/002 220/573.1 |

OTHER PUBLICATIONS

Manufacturing processes joining—Part 1: Assembling—Classification, subdivision, terms and definitions; Sep. 2003; DIN 8593-1; DIN Deutsches Institut fuer Norm e.V.; Germany.
Manufacturing processes joining—Part 2: Filling—Classification, subdivision, terms and definitions; Sep. 2003; DIN 8593-2; DIN Deutsches Institut fuer Norm e.V.; Germany.
Manufacturing processes joining—Part 3: Joining by mechanical means—Classification, subdivision, terms and definitions; Sep. 2003; DIN 8593-3; DIN Deutsches Institut fuer Norm e.V.; Germany.
Manufacturing processes joining—Part 4: Joining by processing amorphous material—Classification, subdivision, terms and definitions; Sep. 2003; DIN 8593-4; DIN Deutsches Institut fuer Norm e.V.; Germany.
Manufacturing processes joining—Part 5: Joining by forming processing—Classification, subdivision, terms and definitions; Sep. 2003; DIN 8593-5; DIN Deutsches Institut fuer Norm e.V.; Germany.
Manufacturing processes joining—Part 6: Joining by welding—Classification, subdivision, terms and definitions; Sep. 2003; DIN 8593-6; DIN Deutsches Institut fuer Norm e.V.; Germany.
Manufacturing processes joining—Part 7: Joining by soldering or brazing—Classification, subdivision, terms and definitions; Sep. 2003; DIN 8593-7; DIN Deutsches Institut fuer Norm e.V.; Germany.
Manufacturing processes joining—Part 8: Joining by means of adhesives—Classification, subdivision, terms and definitions; Sep. 2003; DIN 8593-8; DIN Deutsches Institut fuer Norm e.V.; Germany.

* cited by examiner

HOUSING FOR A CONTROL UNIT

This application is the national stage (Rule 371) of international application No. PCT/EP2015/063899 filed Jun. 22, 2015.

BACKGROUND OF THE INVENTION

Field of the Invention

The invention relates to a housing for a control unit. In particular, the invention relates to a housing for a control unit of a motor vehicle.

A control unit onboard a motor vehicle has electronic components which are disposed in a housing so as to protect said electronic components from damaging environmental influences. In particular, elevated temperatures, vibrations, moisture, dust, or aggressive media may be present onboard the motor vehicle. Fuels, lubricants, hydraulic fluids, or else a salt mist, for example when the motor vehicle is travelling in wintry road conditions on a gritted carriageway, may belong to the group of aggressive media.

The housing may be manufactured from a light-metal die casting. It has been demonstrated that such a housing in the case of prolonged operation onboard a motor vehicle may corrode to the extent that said housing can no longer guarantee the protection of the control unit under certain circumstances. Corrosion may arise in particular in the region of a joint of the housing, said corrosion infiltrating the joint region and in this way ultimately progressing to an internal side of the housing.

It is known for a higher-grade light-metal alloy, for example an aluminum alloy having a reduced proportion of copper, to be used in order for this problem to be avoided. On account thereof, however, material costs for the housing may rise. Taking another approach, a place of the housing element at which joining is to be performed is cleaned by means of an optimized washing process, so as to provide optimal adhesive properties. However, such a washing process is complex and may increase manufacturing costs of the housing. Moreover, no complete neutralization of all contaminants on the surface of the housing element can be ensured by a washing process.

SUMMARY OF THE INVENTION

The invention is based on the object of stating an improved housing having a joint which in particular is less susceptible to corrosion. A further object of the invention lies in stating a matching manufacturing method for the housing. The invention achieves these objects by means of a housing and of a manufacturing method having the features of the independent claims. Dependent claims reflect preferred embodiments.

A housing according to the invention for a control unit onboard a motor vehicle has a housing element and a further element that is attached to the housing element, that is to say is in particular fixed to the housing element. The further element is attached to the housing element by means of a joining technology, that is to say is in particular fastened to the housing element in a joining-layer-free manner, or by means of a joining layer.

The housing element has a main body from a light metal, in particular from a light-metal die casting. Additionally, said housing element has a protective layer that is disposed between the main body and the further element joined thereto. The protective layer is preferably directly adjacent to the light-metal main body. In the case of the further element being fastened by means of a joining layer, for example by means of an adhesive layer, the protective layer is in particular different from the joining layer, that is to say that said protective layer is configured so as to be separate from the joining layer.

In the case of a joining-layer-free fastening, the further element is in particular directly adjacent to the protective layer. In the case of a fastening by means of a joining layer, the joining layer in particular is directly adjacent to the protective layer.

A particularly good connection of the further element to the housing element is achievable by way of the protective layer. The housing in the region of the joint may thus be susceptible to corrosion to a lesser extent. In particular, any infiltration of the joint by corrosion may be avoided.

Joining of the further element to the housing element may comprise in a known manner assembling, filling, press-fitting, master forming, forming, welding, soldering/brazing, textile-based joining, or preferably adhesive bonding. These manners of joining are described in more detail for example in DIN 8593 which is currently applicable.

In the case of one design embodiment, the protective layer at least in places is applied to a face of the main body that faces the further element. In other words, that face that faces the further element is completely covered by the protective layer, or in places is covered by the protective layer and in places is not covered by the protective layer. Part of the surface of the main body is preferably not covered by the protective layer. In this way, the housing is manufacturable in a cost-effective manner.

In particular in the plan view onto the face that faces the further element, the protective surface preferably protrudes laterally beyond the further element. In the case of a fastening of the further element by means of a joining layer, the protective layer preferably also protrudes laterally beyond the joining layer. In particular, a part-region of the surface of the protective layer that faces the further element is not covered by the further element and optionally the joining layer, and in the case of a refinement is exposed. In this way, particularly good protection of the joint from infiltration by corrosion is achievable.

In the case of one design embodiment, the main body has a recess, the protective layer is configured in an encircling manner around the recess, and the further element covers the recess. For example, the protective layer runs in annular manner around the recess. In the case of a design embodiment in which the further element is provided for covering the recess in a fluid-tight manner, that is to say in a liquid-tight and/or gas-tight manner, for example, particularly good fluid-tightness of the joint is achievable in this way.

The protective layer preferably has a metal or an alloy, or is composed thereof. The metal or the alloy, respectively, is preferably applied to a surface of the main body, so as to form the protective layer.

If and when the further element has a metal, the contact between the metal of the further element and the metal of the housing element may be decisive in terms of corrosion resistance. For example, a contact element which, when exposed to an electrolyte such as salt water, for example, displays a known corrosive behavior, may be formed by two dissimilar metals. The housing in terms of construction may be configured such that the corrosion runs in a manner that renders it unlikely that the corrosion reduces or destroys the protective effect of the housing.

In one embodiment, the metal or the alloy, respectively, of the protective layer is chemically more noble than the light metal of the main body. In particular, the chemically less noble material tends to corrode more intensively than the other material. In the present case, the protective layer may be substantially thinner than a wall thickness of the main body, since the main body corrodes prior to the protective layer. On account thereof, the protective layer may be applied rapidly and in a cost-saving manner.

In one other embodiment, the light metal of the main body is chemically more noble than the metal or the alloy, respectively, of the protective layer. On account thereof, the protective layer may act as a sacrificial anode. The corrosion of the main body may be effectively suppressed in this way until the protective layer is completely corroded. How noble a metal is in chemical terms usually depends on the normal potential of the metal in relation to a hydrogen electrode in an aqueous solution at a pH value of 7.

In yet a further embodiment, the metal of the protective layer corresponds to the predominant element of the light metal of the main body in the pure form. The metal of the protective layer is preferably so pure that the former comprises practically no contamination by other substances anymore. On account thereof, the protective layer may be attached relatively easily to the surface of the housing element. A connection between the protective layer and the further element may be facilitated by the purity of the metal.

In one particularly preferred embodiment, the light metal, in particular the light-metal die casting, is an aluminum alloy, and the metal is pure aluminum. On account thereof, the housing may be manufactured in a particularly cost-effective manner.

In one furthermore preferred embodiment, the protective layer extends beyond a bearing face for the further element by not more than a predetermined region. In other words, it is preferable that the main body is not completely provided with the protective layer, but only in a predetermined region around the joint. For example, in particular in the plan view onto the bearing face, the area content that is enclosed by the external contour of the protective layer is at most double the size of the area content that is enclosed by the external contour of the bearing face. On account thereof, the complexity for providing the protective layer on the housing element may be reduced. On account thereof, manufacturing costs for the housing may be lowered.

In one variant, the further element has a cover for closing the housing element. In this case, the protective layer may be applied in a comparatively large contiguous part-region. The cover is a housing lid, for example, the main body on a connection region to the housing lid having a sealing groove, and in the region of the sealing nut being provided with the protective layer. In particular, the sealing groove may be cladded with the protective layer.

In one other variant, the further element has a functional component. The protective layer herein may preferably be attached to a relatively small component region on the surface of the housing element. The functional element may contain an electric component, for example, such as an electric power element, in particular a power semi-conductor such as a power transistor. However, the functional component may also be of a mechanical nature. For example, a fastening element or a pressure-equalization element for equalizing an internal pressure of the housing with an external pressure may be implemented by way of the functional component. In particular in this case, the further element preferably also has a cover for closing the housing element, specifically for preferably closing the recess, or one of the recesses, of the main body, respectively. The cover may be configured so as to be integrated into the functional component. The cover is configured as a liquid-repellant and gas-permeable membrane for pressure equalization, for example.

According to one further aspect, a method for manufacturing a housing for a control unit is stated.

According to one step of the method, a main body of a housing element from a light metal, in particular of a housing element according to one of the design embodiments described above, is provided. In the case of one refinement, the method comprises a preceding step in which the main body is manufactured by means of die casting.

In a subsequent method step, a protective layer is applied to the main body. A further element is attached to the housing element in the region of the protective layer by means of a joining technology during a method step following the application of the protective layer. For example, the method comprises establishing a welded connection between the further element and the protective layer, or applying a joining layer, in particular an adhesive layer, to the protective layer.

The housing for the control unit may be provided with minor complexity by the method. In this way, the above-described advantages of the housing may be implemented in a cost-effective manner. The manufacturing method may be capable of ready integration into a known manufacturing process.

According to one further aspect, a control unit having the housing is stated. The control unit expediently has an electronics board which is received in the housing and is disposed in particular in the housing element.

Further advantages and advantageous design embodiments and refinements of the housing and of the control unit and of the method are derived from the following exemplary embodiments that are illustrated in conjunction with the figures in which:

DESCRIPTION OF THE INVENTION

Figure 1:
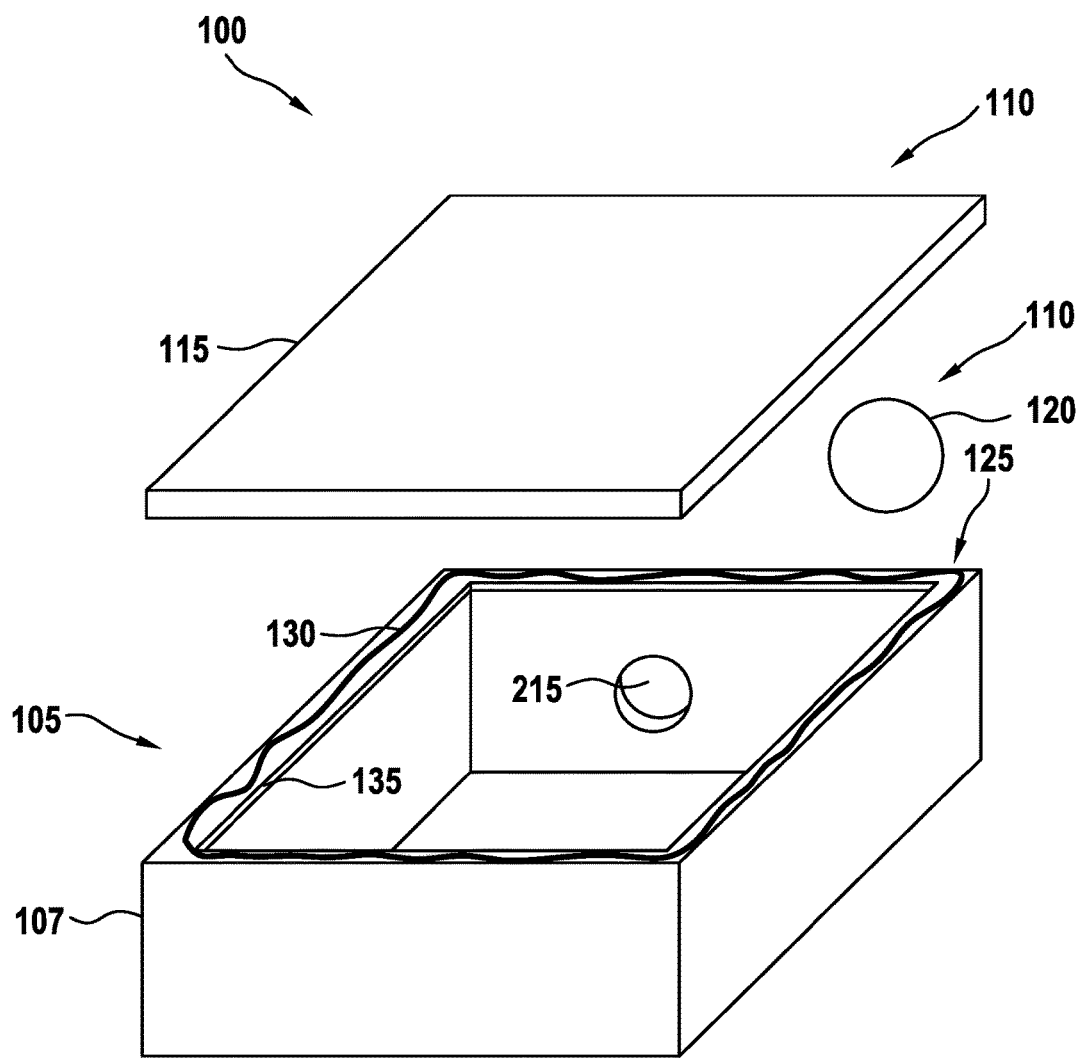
FIG. 1 shows a housing for a control unit, having a main body from light metal.

FIG. 1 shows a housing 100 for a control unit, in particular onboard a motor vehicle, in an exploded illustration. The housing 100 has a housing element 105 having a main body 107 from a light-metal die casting. Without limiting the general aspect, an aluminum die casting may be used in particular. Furthermore, the housing 100 in the present case has two further elements 110 which are adapted for connection to the housing element 105 by means of a joining technology, in particular by adhesive bonding or welding, and which in the completed state of the housing are connected to the housing element 105 by means of a joining technology, in particular by adhesive bonding or welding.

The one further element 110 in the present case has a cover 115 for closing the housing element 105. More specifically, the cover 115 is a housing lid which closes the upper side that is open in order for an electronics board to be inserted during the assembly of the control unit.

The other further element 110 has a functional component 120. In the embodiment illustrated, the functional component 120 contains a pressure-equalization element (PEE) which may have a membrane, in particular. In the assembled state, the membrane covers a recess 215 of the main body 107 of the housing element 105. Said membrane may expediently be liquid-tight and gas-permeable, such that said membrane enables a pressure equalization between the housing interior and the environment and prevents moisture from penetrating through the recess 215. A polytetrafluoroethylene (PTFE) membrane may be provided, for example, which may be adhesively bonded to the housing element 105. In the embodiment illustrated, the attachment of the functional element 120 to an external surface of the housing element 105, that is to say to a surface that faces away from the interior space of the main body 107, is provided (obscured in the illustration of FIG. 1). In other embodiments, the functional element 120 may also be attached to an internal surface, for example if said functional element 120 is an electronic element or a fastening element.

A joint 125 is configured where the respective further element 110 is connected to the housing element 105. The element 110 is held on the housing element 105 at the joint 125 by means of a joining technology, in particular by means of an adhesive connection. To this end, a joining layer 130 from an adhesive is disposed in particular in the region of the joint 125, between the further element 110 and the housing element 105. In order for a functional component 120 (PEE) to be fastened, the adhesive 130 may in particular be an acrylate adhesive which in particular is pressure-sensitive, that is to say which builds up the adhesion to the mating partner under mechanical pressure. In order for a cover 115 to be fastened, the adhesive 130 may in particular be a silicone adhesive, for example a moisture-cross linking silicone adhesive.

According to the invention, a protective layer 135 of the housing element 105 is attached to the main body 107. A particularly good joint-type connection between the further element 110 and the housing element 105 is achievable by means of the protective layer 135. In particular, the protective layer 135 may facilitate improved adhesion of the adhesive 130. Furthermore, the protective layer 135 is preferably configured for counteracting any corrosion in the region of the joint 125, in particular any infiltration of the joint 125 by corrosion. On account thereof, it may be prevented that the corrosion reaches an internal region of the housing 100. In particular, electronic components of a control unit that are disposed within the housing may be effectively protected for a prolonged period of time from damaging environmental influences in this way. In the case of the present exemplary embodiment, the protective layer 135 is composed of aluminum, and the main body 107 is composed of an aluminum alloy. Examples of further potential design embodiments of the protective layer 135 and of the main body 107 are described further above.

The joint 125 at which the housing lid (that is to say the cover 115) is fastened to the housing element 105 in order for the open upper side of the housing element 105 to be closed is indicated in a heavily schematic manner in FIG. 1. For example, the upper periphery of the side walls of the main body 107 may be provided with the protective layer 135, and the joining layer 130 may be applied to the upper periphery that is provided with the protective layer 135, for example in the form of an adhesive bead, in particular of a strand of an elastic sealing material. In the case of one design embodiment, the joining layer 130 may at least partially be disposed in a groove of the upper periphery (not illustrated in FIG. 1).

Figure 2:
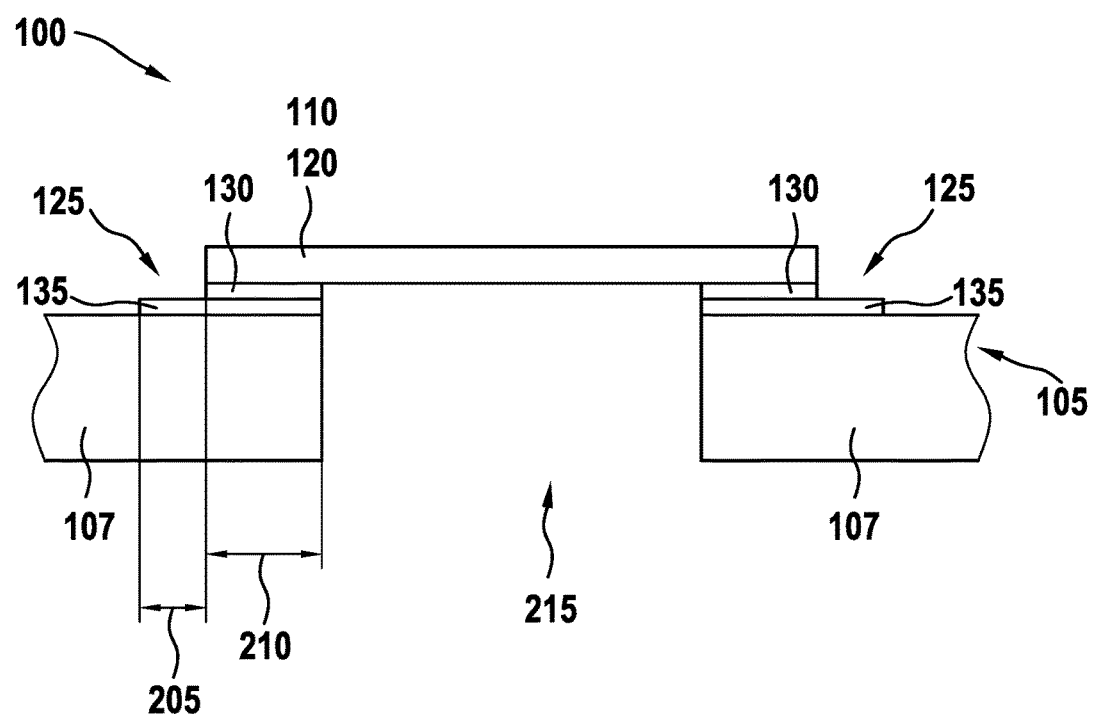
FIG. 2 shows a sectional view of a portion of the housing of FIG. 1.

FIG. 2 shows a sectional view of a portion of the housing 100 of FIG. 1, in the region of the joint 125 of the further element 110 which contains the functional component 120 having the membrane. The functional component 120 is illustrated in an exemplary manner in the form of a pressure-equalization element which is already attached to the housing element 105 by means of adhesive bonding.

The protective layer 135 is attached to a surface of the main body 107 of the housing element 105 in the region of the joint 125. Herein, the protective layer 135 preferably extends beyond a bearing face 210 on which the further element 110 is attached to the housing element 105 by a predetermined region 205. In the embodiment illustrated, the further element 110 covers a recess 215 in one of the side walls of the main body 107 such that the bearing face 210 and the protective layer 135 run in an annular manner around the recess 215, and the internal contours of the bearing face 210, of the protective layer 135, and of the recess 215, in the plan view onto the recess 215 are at least substantially congruent.

In the case of the illustrated example of an adhesive connection, the adhesive that forms the joining layer 130 is applied to the protective layer 135. In other embodiments, the adhesive, or the joining layer 130, respectively, may only be provided in the region of the bearing face 210. Optionally, the adhesive may also be applied to the region 205 that runs there beyond and that is not covered by the further element 110, in which region 205 the protective layer 135 in the present exemplary embodiment is exposed. In yet one further embodiment, the adhesive may extend beyond the external contour of the protective layer 135.

The further element 110 is disposed so as to bear on the joining layer 130. In the embodiment illustrated, a tight connection between the further element 110 and the housing element 105 is preferably achieved in that the joining layer 130 is configured so as to completely encircle the recess 215.

Figure 3:
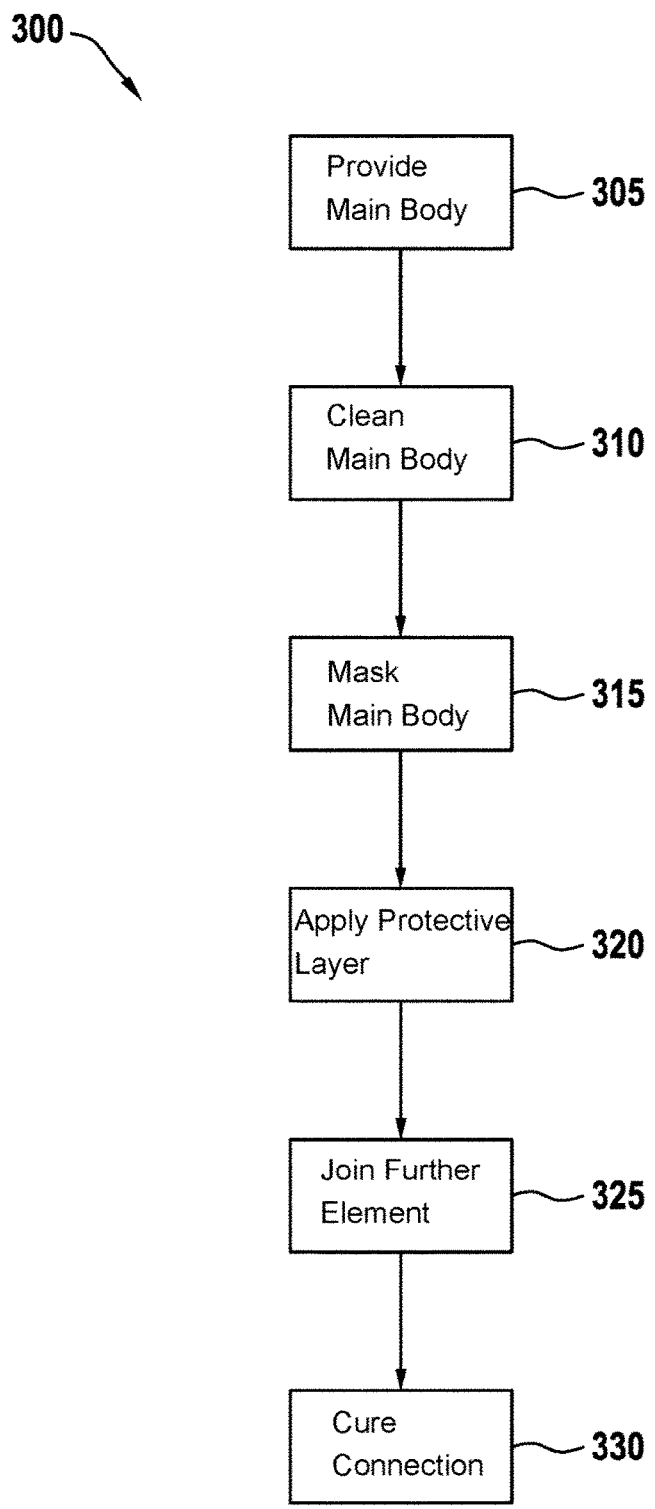
FIG. 3 shows a flow diagram of a method for manufacturing the housing of FIG. 1.

FIG. 3 shows a flow diagram of a method 300 for manufacturing the housing 100 of FIG. 1. In a first step 305, the main body 107 is provided. The main body is optionally cleaned in a subsequent step 310. In a further optional step 315, the main body 107 is masked so as to define where the protective layer 135 is applied to the surface of the main body 107 in the subsequent step 320.

The application of the protective layer 135 in step 320 may be performed galvanically, by welding, sputtering, or by way of a metallurgical connection, for example. In a preferred manner, the protective layer is applied by way of a powder-metallurgical compound. Herein, the alloying element of the protective layer 135 may be applied by way of a special method, for example, in which the powder on the housing 100 is fused in a localized manner by means of a plasma ray, so as to subsequently wet the surface.

Thereafter, in a step 325, the further element 110 is joined to the housing element 105 in the region of the protective layer 320. It is preferable herein that joining in step 325 is performed as immediately as possible after the application of the protective layer 135 in step 320. On account thereof, it may be avoided that the surface of the protective layer 135, prior to the further element being attached thereto, is subjected to any contamination. Joining 325 may comprise the application of a joining layer 130, in particular of an adhesive layer.

The joint connection between the further element 110 and the housing element 105 may set or cure in an optional step 330. To this end, curing may be stimulated by means of pressure, ultraviolet light, or heat, for example. The step 330 may be performed simultaneously with further processing steps on the housing 100.

The invention claimed is:

1. A housing for a control unit of a motor vehicle, the housing comprising:
   a housing element having a main body formed of a light metal;
   a further element attached to said housing element by way of a joining technique that does not use a joining layer or by way of a joining layer; and
   a protective layer applied to said main body and disposed between said main body and said further element joined to said main body;
   said main body having a surface, said protective layer composed of a metal applied to said surface of said main body, and said metal of said protective layer corresponding to a predominant element of said light metal in pure form; and
   said main body formed with a recess, said protective layer configured to encircle said recess, and said further element covering said recess.

2. The housing according to claim 1, wherein said protective layer is applied, in places, to a face of said main body that faces said further element and said protective layer protrudes laterally beyond said further element.

3. The housing according to claim 2, wherein said protective layer projects laterally beyond said joining layer.

4. The housing according to claim 1, wherein said light metal is an aluminum alloy, and said metal of said protective layer is pure aluminum.

5. The housing according to claim 1, wherein said protective layer extends beyond a bearing face for said further element by not more than a predetermined range.

6. The housing according to claim 1, wherein said further element has a cover for closing the housing element.

7. The housing according to claim 1, wherein said further element comprises a functional component.

* * * * *